United States Patent
Dalal et al.

(10) Patent No.: US 12,532,565 B2
(45) Date of Patent: Jan. 20, 2026

(54) METHOD OF RECOVERING HGCDTE DETECTOR PERFORMANCE AFTER HIGH TEMPERATURE BIAS-INDUCED DEFECT GENERATION

(71) Applicant: Teledyne Scientific & Imaging, LLC, Thousand Oaks, CA (US)

(72) Inventors: Milap Dalal, Lansdale, PA (US); Henry Yuan, North Wales, PA (US); Chad Shultz, Reading, PA (US); Andrey Rumyantsev, Feasterville, PA (US)

(73) Assignee: TELEDYNE SCIENTIFIC & IMAGING, LLC, Thousand Oaks, CA (US)

( * ) Notice: Subject to any disclaimer, the term of this patent is extended or adjusted under 35 U.S.C. 154(b) by 426 days.

(21) Appl. No.: 18/326,192

(22) Filed: May 31, 2023

(65) Prior Publication Data
US 2024/0405150 A1 Dec. 5, 2024

(51) Int. Cl.
*H10F 71/00* (2025.01)
*H10F 77/123* (2025.01)

(52) U.S. Cl.
CPC ....... *H10F 71/128* (2025.01); *H10F 71/1253* (2025.01); *H10F 77/1237* (2025.01)

(58) Field of Classification Search
CPC . H10F 71/128; H10F 71/1253; H10F 77/1237
See application file for complete search history.

(56) References Cited

U.S. PATENT DOCUMENTS

| 11,060,922 B2* | 7/2021 | Altenbeck | G01J 5/0804 |
| 11,211,513 B2* | 12/2021 | Hermes | H10F 77/30 |
| 2022/0085225 A1* | 3/2022 | Guyot-Sionnest | H10F 77/1433 |

OTHER PUBLICATIONS

Bai et al., Effects of annealing on HgCdTe detectors after γ irradiation, High Power Laser and Particle Beams, Feb. 2007, 19(2) 301-304. Abstract only.

* cited by examiner

*Primary Examiner* — Earl N Taylor
(74) *Attorney, Agent, or Firm* — K&L Gates LLP

(57) ABSTRACT

A method of baking a detector, the method comprising: placing a mid-wave infrared detector in an environmental chamber, wherein the environmental chamber is opaque. The mid-wave infrared detector comprises an anode, a guard terminal, and a cathode. The method further comprising connecting the anode to the cathode in a short circuit configuration, heating the environmental chamber to a bake temperature selected in the range of 60 to 70 degrees Celsius, and maintaining the detector in the environmental chamber for a period selected in the range of 72 hours to 240 hours.

9 Claims, 2 Drawing Sheets

METHOD OF RECOVERING HGCDTE DETECTOR PERFORMANCE AFTER HIGH TEMPERATURE BIAS-INDUCED DEFECT GENERATION

FIELD

This disclosure relates generally to the field of optoelectronics.

SUMMARY

In part, in one aspect, the disclosure relates to a method of baking a detector. The method comprises placing a mid-wave infrared detector in an environmental chamber, wherein the environmental chamber is opaque, wherein the mid-wave infrared detector comprises an anode, a guard terminal, and a cathode. The method further comprises connecting the anode to the cathode in a short circuit configuration, heating the environmental chamber to a bake temperature selected in the range of 60 to 70 degrees Celsius, and maintaining the detector in the environmental chamber for a period selected in the range of 72 hours to 240 hours.

Although, the disclosure relates to different aspects and embodiments, it is understood that the different aspects and embodiments disclosed herein can be integrated, combined, or used together as a combination system, or in part, as separate components, devices, and systems, as appropriate. Thus, each embodiment disclosed herein can be incorporated in each of the aspects to varying degrees as appropriate for a given implementation. Further, the various apparatus, optical elements, passivation coatings/layers, optical paths, waveguides, splitters, couplers, combiners, electro-optical devices, inputs, outputs, ports, channels, components and parts of the foregoing disclosed herein can be used comprising detector, sensor, laser, laser-based communication system, waveguide, fiber, transmitter, transceiver, receiver, and other devices and systems without limitation. These and other features of the applicant's teachings are set forth herein.

BRIEF DESCRIPTION OF THE FIGURES

Unless specified otherwise, the accompanying drawings illustrate aspects of the innovations described herein. Referring to the drawings, wherein like numerals refer to like parts throughout the several views and this specification, several embodiments of presently disclosed principles are illustrated by way of example, and not by way of limitation. The drawings are not intended to be to scale. A more complete understanding of the disclosure may be realized by reference to the accompanying drawings in which.

DETAILED DESCRIPTION

A mid-wave infrared detector can be damaged, such as degradation to detector noise and dark current. This can occur after operation at high temperature while under reverse bias. A high temperature is a temperature higher than the nominal operating temperature of the mid-wave detector. For example, the high temperature is greater than or equal to 18 degrees Celsius. This disclosure is directed to baking the damaged device to improve the device's performance. Different baking temperatures and baking times can affect the performance improvement.

Figure 1:
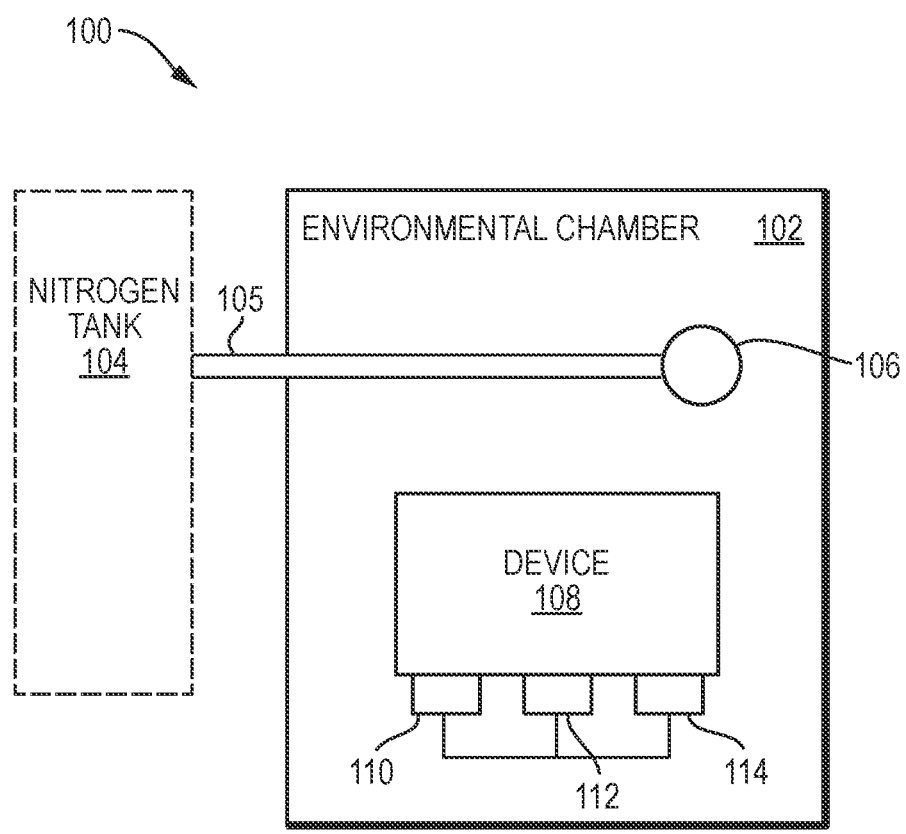
FIG. 1 is an apparatus 100 for baking a device according to an exemplary embodiment of the disclosure.

FIG. 1 is an apparatus 100 for baking a device according to an exemplary embodiment of the disclosure. The apparatus 100 comprises an environmental chamber 102. In one aspect, the environmental chamber 102 is opaque to prevent light from penetrating through the environmental chamber 102. The environmental chamber 102 is to control at least temperature and humidity within the environmental chamber 102. A device (detector) 108 is provided within the environmental chamber 102. In one aspect, the device 108 is a mid-wave infrared detector. In one aspect, the infrared detector comprises an infrared element. In one aspect, the detector comprises materials selected from the group consisting of Mercury, Cadmium, and Tellurium.

In one aspect, the device 108 comprises an anode 110 and a cathode 112 connected in a short circuit configuration. The detector 108 further comprises a guard terminal 114. The guard 114 is connected to the anode 110 and the cathode 112 in a short circuit configuration.

In one aspect, the chamber is to control the temperature in a range of 60 to 70 degrees Celsius for a period of time. The environmental chamber 102 is to maintain the temperature for a period of time in the range of 72 to 240 hours. In one aspect, the period is based on the bake temperature of the environmental chamber 102. For example, the lower the baking temperature, the longer the period of time the detector must be baked at that temperature for. In one aspect, the temperature of the detector is maintained in a range of 60 to 70 degrees Celsius for a period of time.

In one aspect, the chamber 102 is to control the humidity by lowering the humidity in the chamber 102. In one aspect, the chamber 102 is coupled to a nitrogen tank 104 and the chamber has a one way valve 106. The nitrogen tank 104 comprises purified nitrogen gas. The chamber 102 controls humidity by purging the environmental chamber 102 with purified nitrogen gas having a nitrogen gas concentration selected in the range of 99% to 99.999%. The purified nitrogen gas flows through tube 105 and enters the chamber 102 and air exits through the one way valve 106. Tube 105 is coupled between the nitrogen tank 104 and the one way valve 106. The force of the nitrogen coming through the valve 106 displaces the air and pushes the air out of the environmental chamber 102 through a gap between the tube 105 and valve 106. In one aspect, the nitrogen purge begins before the detector 108 is provided in the environmental chamber 102. This prevents the devices from being inserted into an atmosphere with high humidity.

Figure 2:
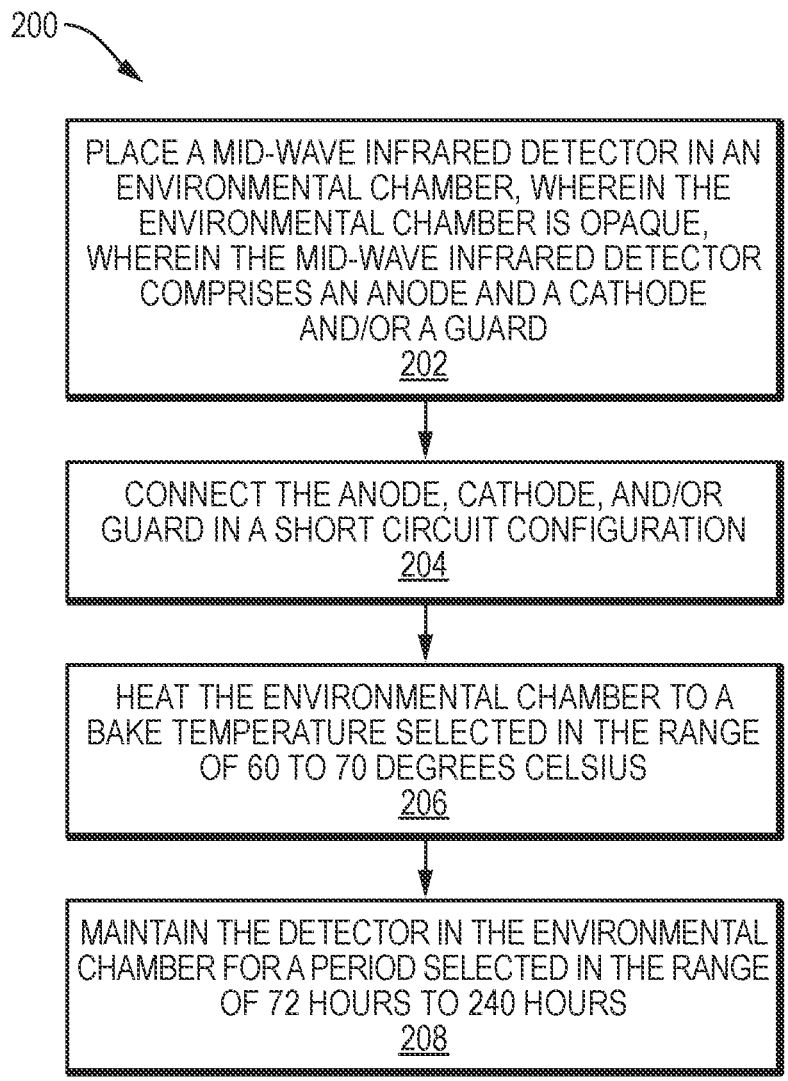
FIG. 2 is a method 200 of baking a device according to an exemplary embodiment of the disclosure.

FIG. 2 is a method 200 of baking a device according to an exemplary embodiment of the disclosure. The method 200 comprises placing 202 a mid-wave infrared detector in an environmental chamber 102. In one aspect, the environmental chamber 102 is opaque to prevent light from reaching the mid-wave infrared detector. The mid-wave infrared detector comprises an anode and a cathode. The method further comprises connecting 204 the anode 110 to the cathode 112 in a short circuit configuration. The method further comprises heating 206 the environmental chamber 102 to a bake temperature selected in the range of 60 to 70 degrees Celsius and maintaining 208 the detector in the environmental chamber 102 for a period selected in the range of 72 hours to 240 hours. In one aspect, the period is based on the bake temperature of the environmental chamber 102.

In one aspect, the detector further comprises a guard terminal 114. The method 200 further comprises connecting the guard 114 to the anode 110 and the cathode 112 in a short circuit configuration.

In one aspect, the detector comprises materials selected from the group consisting of Mercury, Cadmium, and Tellurium.

In one aspect, the method 200 further comprises controlling humidity of the environmental chamber. In one aspect, controlling the humidity comprises purging the environmental chamber 102 with purified nitrogen gas having a nitrogen gas concentration selected in the range of 99% to 99.999%. For example, the purging of the environmental chamber 102 begins before the device is provided in the environmental chamber. This ensures that the device is not subject to high humidity.

In one aspect, the method 200 further comprises, prior to heating the detector in the environmental chamber 102, cooling the detector to an operating temperature lower than the bake temperature and measuring a pre-bake dark current and noise of the detector at the operating temperature at a predetermined frequency. For example, the detector is cooled below 60 degrees Celsius. In one aspect, measuring the pre-bake dark current and noise of the detector 108 is done outside the environmental chamber 102. The predetermined frequency is in a range from 100 Hz up to and including 10 kHz. In one aspect, measurements of the pre-bake dark current and noise are taken at a plurality of frequencies within the range.

In one aspect, the method 200 further comprises, after baking the detector for the period, cooling the detector to an operating temperature lower than the bake temperature, measuring dark current and noise of the detector at the operating temperature at a predetermined frequency, and comparing the post-bake dark current and noise measurements with the pre-bake dark current and noise measurements. The comparison is between the pre-bake dark current and noise and the post-bake dark current and noise at the same frequency. In one aspect, the measuring of the dark current and noise of the detector 108 is done outside the environmental chamber. The temperature of the detector at the pre-bake measurement and post-bake measurement is the same to ensure that the noise characteristics are based on the baking process. The measurement process is the same for the pre-bake and post-bake to ensure the noise characteristics are based on the baking process. For example, the post-bake measurement frequency is the same as the pre-bake measurement frequency for each comparison. In one aspect, there is a comparison for each of the frequencies for the pre-bake and post-bake measurements.

In one aspect, the method 200 repeats for detectors with noise or dark current change of greater than 10% after measuring.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

Where a range or list of values is provided, each intervening value between the upper and lower limits of that range or list of values is individually contemplated and is encompassed within the disclosure as if each value were specifically enumerated herein. In addition, smaller ranges between and including the upper and lower limits of a given range are contemplated and encompassed within the disclosure. The listing of exemplary values or ranges is not a disclaimer of other values or ranges between and including the upper and lower limits of a given range.

The use of headings and sections in the application is not meant to limit the disclosure; each section can apply to any aspect, embodiment, or feature of the disclosure. Only those claims which use the words "means for" are intended to be interpreted under 35 USC 112(f). Absent a recital of "means for" in the claims, such claims should not be construed under 35 USC 112. Limitations from the specification are not intended to be read into any claims, unless such limitations are expressly included in the claims.

Embodiments disclosed herein may be embodied as a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module," or

What is claimed is:

1. A method of baking a detector, the method comprising:
placing a mid-wave infrared detector in an environmental chamber, wherein the environmental chamber is opaque, wherein the mid-wave infrared detector comprises an anode, a guard terminal, and a cathode;
connecting the anode to the cathode in a short circuit configuration;
heating the environmental chamber to a bake temperature selected in the range of 60 to 70 degrees Celsius; and
maintaining the detector in the environmental chamber for a period selected in the range of 72 hours to 240 hours.

2. The method of claim 1, the method further comprises connecting the guard to the anode and the cathode in a short circuit configuration.

3. The method of claim 1, wherein the detector comprises materials selected from the group consisting of Mercury, Cadmium, and Tellurium.

4. The method of claim 1, wherein the period is based on the bake temperature of the environmental chamber.

5. The method of claim 1, further comprising controlling humidity of the environmental chamber.

6. The method of claim 5, further comprising purging the environmental chamber with purified nitrogen gas having a nitrogen gas concentration selected in the range of 99% to 99.999%.

7. The method of claim 1, further comprising:
prior to heating the detector in the environmental chamber:
cooling the detector to an operating temperature lower than the bake temperature;
measuring a pre-bake dark current and a pre-bake noise of the detector at the operating temperature at a predetermined frequency;
after baking the detector for the period:
cooling the detector to an operating temperature lower than the bake temperature;
measuring a post-bake dark current and a post-bake noise of the detector at the operating temperature at a predetermined frequency;
comparing the pre-bake dark current with the post-bake dark current and the pre-bake noise with the post-bake noise; and
repeating method of claim 1 for detectors with noise or dark current change of greater than 10%.

8. The method of claim 1, wherein the infrared detector comprises an infrared element.

9. The method of claim 1, further comprising, prior to locating the detector in the environmental chamber, purging the environmental chamber with purified nitrogen gas having a nitrogen gas concentration selected in the range of 99% to 99.999%.

* * * * *